(12) United States Patent
Kawamori et al.

(10) Patent No.: US 8,130,475 B2
(45) Date of Patent: Mar. 6, 2012

(54) METHOD FOR MANUFACTURING CPP-TYPE THIN FILM MAGNETIC HEAD PROVIDED WITH A PAIR OF MAGNETICALLY FREE LAYERS

(75) Inventors: Keita Kawamori, Tokyo (JP); Yoshihiro Tsuchiya, Tokyo (JP); Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 316 days.

(21) Appl. No.: 12/588,559

(22) Filed: Oct. 20, 2009

(65) Prior Publication Data

US 2011/0091744 A1    Apr. 21, 2011

(51) Int. Cl.
*G11B 5/127*    (2006.01)
*G11B 5/33*    (2006.01)
*B32B 37/02*    (2006.01)

(52) U.S. Cl. ............... 360/324.12; 428/810; 156/221
(58) Field of Classification Search ............. 360/324.12, 360/324.11, 324.2; 428/810; 156/221
See application file for complete search history.

(56) References Cited

U.S. PATENT DOCUMENTS

| 6,110,330 | A | * | 8/2000 | Lin et al. ................. 204/192.16 |
| 6,139,936 | A | * | 10/2000 | Weiss ............................ 428/141 |
| 6,724,585 | B2 | | 4/2004 | Hayashi |
| 6,903,908 | B2 | | 6/2005 | Hayashi et al. |
| 7,341,876 | B2 | * | 3/2008 | Cyrille et al. ..................... 438/3 |
| 7,351,483 | B2 | * | 4/2008 | Parkin ........................ 428/811.1 |
| 8,000,066 | B2 | * | 8/2011 | Mizuno et al. ............. 360/324.2 |
| 8,014,108 | B2 | * | 9/2011 | Shimazawa et al. .......... 360/319 |
| 2009/0034132 | A1 | | 2/2009 | Miyauchi et al. |
| 2009/0135529 | A1 | | 5/2009 | Shimazawa et al. |
| 2010/0149689 | A1 | * | 6/2010 | Tsuchiya et al. ........... 360/234.3 |
| 2011/0051291 | A1 | * | 3/2011 | Miyauchi et al. .......... 360/245.3 |

FOREIGN PATENT DOCUMENTS

JP    A-2007-109807    4/2007

* cited by examiner

*Primary Examiner* — Allen Cao
(74) *Attorney, Agent, or Firm* — Posz Law Group, PLC (57) ABSTRACT

The present invention relates to a method of manufacturing a DFL type thin film magnetic head. The method includes laminating each of the layers from the lower magnetization control layer to the upper exchange coupling layer above the substrate; laminating an auxiliary magnetization control layer including at least a CoZrTa layer above the upper exchange coupling layer; forming at least each of the layers from the lower exchange coupling layer to the auxiliary magnetization control layer in pillar shape, and disposing the bias magnetic field application layer at an opposite position with respect to the ABS of each of the pillar shaped layers; trimming the auxiliary magnetization control layer by removing a part of the auxiliary magnetization control layer that is formed in the pillar shape, and disposing the upper shield layer such that the trimmed auxiliary magnetization control layer is at least covered.

11 Claims, 9 Drawing Sheets

METHOD FOR MANUFACTURING CPP-TYPE THIN FILM MAGNETIC HEAD PROVIDED WITH A PAIR OF MAGNETICALLY FREE LAYERS

BACKGROUND OF THE INVENTION

1. Field of the Invention

The present invention relates to a thin film magnetic head. Specifically, it relates to a method for manufacturing a thin film magnetic head provided with a pair of magnetization free layers whose magnetization directions vary according to an external magnetic field.

2. Description of the Related Art

Conventionally, a spin valve head is known as a head having high power and high sensitivity and used for a hard disk drive (HDD). In order to fix a magnetization direction of one ferromagnetic layer of a pair of ferromagnetic layers that are disposed on both sides of a non-magnetic intermediate layer, an antiferromagnetic layer made of a material such as IrMn is used for the spin valve head. Since the antiferromagnetic layer has a relatively thicker film thickness, and may restrict further high recording density (narrowing of a read gap), a new concept attempts to narrow a read gap. In this specification, the read gap refers to a gap between upper and lower shield layers.

A thin film magnetic head is disclosed in the specification of U.S. Patent Application Publication No. 2009/0034132. The thin film magnetic head has two magnetization free layers (upper and lower magnetization free layers) whose magnetization directions vary according to an external magnetic field, and a non-magnetic intermediate layer that is sandwiched by the two magnetization free layers. In this specification, a magneto-resistance (MR) element having the above-described configuration may be indicated as having dual free layers (DFL). The two magnetization free layers are exchange-coupled based on RKKY (Rudermann, Kittel, Kasuya, and Yoshida) interaction through the non-magnetic intermediate layer. The two magnetization free layers are magnetized in antiparallel directions to each other under the state that a magnetic field is not applied at all. In this specification, "antiparallel" means that magnetization directions are parallel but opposed to each other. A bias magnetic layer is disposed on rear sides of the two magnetization free layers, seen from an air bearing surface (ABS), and a bias magnetic field is applied in an orthogonal direction to the ABS. Magnetization directions of the two magnetization free layers form a certain relative angle by the magnetic field generated from the bias magnetic layer. Under this state, when an external magnetic field, which is in an orthogonal direction to the ABS, is applied from a recording medium, the magnetization directions of the two magnetization free layers vary, the relative angle between the magnetization directions of the two magnetization free layers varies, and an electrical resistance of a sense current varies. Therefore, the external magnetic field may be detected by using the above-described property.

Since the film configuration configured with the two magnetization free layers needs no antiferromagnetic layer, the film configuration is simplified. As a result, it becomes easier to narrow the read gap. Specifically, the following configuration has an advantage: exchange coupling layers (upper and lower exchange coupling layers) formed of, for example, ruthenium are disposed in an outside of the two magnetization free layers, and magnetization control layers (upper and lower magnetization control layers) whose magnetization directions are fixed are disposed outside the exchange coupling layers as parts of upper and lower shield layers. In this configuration, exchange coupling through the exchange coupling layers magnetizes the two magnetization free layers in antiparallel directions to each other under a state where the magnetic field is not applied at all. Since the magnetization control layers are disposed as a part of the shield layer, it does not configure the read gap, and it is favorable to narrow the read gap.

In order to manufacture the thin film magnetic head having the above described configuration, a lower shield layer is formed, several layers including the two magnetization free layers and the two exchange coupling layers are sequentially formed above the lower shield layer, and these layers are formed in a pillar shape. These layers are formed in the pillar shape by disposing a resist on the formed layer, and applying a known method such as ion beam etching. In this case, a non-magnetic layer (a cap layer) made of Ta, Ru, or the like is formed on an upper exchange coupling layer due to photo-process. However, when a pillar forming process is finished, the non-magnetic layer needs to be completely removed. Because, if the non-magnetic layer remained, not enough exchange coupling strength would be generated between the upper magnetization control layer and the upper magnetization free layer.

When the non-magnetic layer is completely removed, the upper exchange coupling layer positioned directly thereunder receives significant damage. Therefore, it is desirable that a passivation layer for the upper exchange coupling layer is disposed between the non-magnetic layer and the upper exchange coupling layer. The passivation layer is preferably formed with a NiFe layer. The passivation layer not only protects the upper exchange coupling layer, but also magnetically integrates the upper magnetization control layer laminated thereon. The passivation layer functions as a part of the upper magnetization control layer during operation of the head. Hereafter, the passivation layer is designated as an auxiliary magnetization control layer. In such a configuration, the auxiliary magnetization control layer additionally functions as an upper shield layer. On the other hand, the layer does not configure the read gap so that it is favorable for decreasing the read gap. A CoFe layer is inserted between the upper exchange coupling layer and the NiFe layer to strengthen the exchange coupling strength of the upper exchange coupling layer.

In order to completely remove the non-magnetic layer, a portion of the auxiliary magnetization control layer needs to be removed. However, removing the portion of the auxiliary magnetization control layer makes a remaining thickness of the auxiliary magnetization control layer thinner, and may decrease the exchange coupling strength through the upper exchange coupling layer. The auxiliary magnetization control layer has to be maintained at an appropriate remaining thickness. Therefore, an initial film thickness of the auxiliary magnetization control layer becomes thicker as a consequence.

Generally, in a pillar forming process, films are not formed in a pillar shape having uniform cross sections in a bottom up (thickness) direction. The films are formed in a conical trapezoidal shape having a flared bottom portion, or in a shape whose cross section is trapezoidal. If the initial film thickness of the auxiliary magnetization control layer is increased, the width of the pillar portion of two magnetization free layers would become thick. Therefore, it may restrict a track per inch (TPI) in a track direction of the head. Accordingly, the initial film thickness of the auxiliary magnetization control layer is more desirable when the thickness is as thin as possible. However, as described above, there is a limit in view of the exchange coupling strength.

If conditions of the photoprocess were reconsidered, it would be possible that a resist layer is disposed directly on the auxiliary magnetization control layer. However, in this case, a surface of the auxiliary magnetization control layer is oxidized, and the oxidized surface of the auxiliary magnetization control layer needs to be removed. Therefore, in either case, a surface layer portion of the auxiliary magnetization control layer needs to be removed, and the auxiliary magnetization control layer has to be formed thicker in advance, so that a similar problem occurs.

SUMMARY OF THE INVENTION

The present invention relates to a method of manufacturing a thin film magnetic head, the thin film magnetic head including: a magneto-resistance (MR) stack configured with a lower magnetization free layer whose magnetization direction varies according to an external magnetic field, a non-magnetic intermediate layer, and an upper magnetization free layer whose magnetization direction varies according to the external magnetic field, the layers being respectively contacted and positioned in the above order from a substrate; a lower magnetization control layer that is positioned between the substrate and the lower magnetization free layer, whose magnetization direction is fixed in a direction parallel to an air bearing surface (ABS); a lower exchange coupling layer that is positioned between the lower magnetization free layer and the lower magnetization control layer, generating an exchange coupling between the lower magnetization free layer and the lower magnetization control layer; an upper shield layer that is disposed at an opposite side from the substrate with respect to the MR stack, including an upper magnetization control layer whose magnetization direction is fixed in a direction parallel to the ABS, the upper magnetization control layer disposed at an edge surface close to the upper magnetization free layer of the upper shield layer; an upper exchange coupling layer that is positioned between the upper magnetization free layer and the upper magnetization control layer, generating an exchange coupling between the upper magnetization free layer and the upper magnetization control layer, wherein the magnetization direction of the lower magnetization free layer due to the exchange coupling between the lower magnetization free layer and the lower magnetization control layer and the magnetization direction of the upper magnetization free layer due to the exchange coupling between the upper magnetization free layer and the upper magnetization control layer are antiparallel; a bias magnetic field application layer that is positioned at a rear side of the MR stack relative to the ABS, applying a bias magnetic field that is in an orthogonal direction with respect to the ABS to the MR stack, and in which a sense current flows in an orthogonal direction with respect to a film surface of the MR stack.

The objective of the present invention is to provide a method for manufacturing the thin film magnetic head having such a configuration. The method ensures an exchange coupling strength of the upper magnetization control layer, and has few restrictions for a TPI in a track direction of the head.

The method of manufacturing the thin film magnetic head of the present invention includes: laminating each of the layers from the lower magnetization control layer to the upper exchange coupling layer above the substrate; laminating an auxiliary magnetization control layer including at least a CoZrTa layer above the upper exchange coupling layer; forming at least each of the layers from the lower exchange coupling layer to the auxiliary magnetization control layer in a pillar shape, and disposing the bias magnetic field application layer at an opposite position with respect to the ABS of each of the pillar shaped layers; trimming the auxiliary magnetization control layer by removing a part of the auxiliary magnetization control layer that is formed in the pillar shape; and disposing the upper shield layer such that the trimmed auxiliary magnetization control layer is at least covered.

An inventor of the present invention thinks there is a reason that the exchange coupling strength of the auxiliary magnetization control layer decreases. The reason is that NiFe (especially Ni) is implanted to a CoFe layer and an action of the CoFe layer to increase the exchange coupling strength between the upper magnetization free layer and the upper magnetization control layer decreases, when a non-magnetic layer or an oxidized portion of the auxiliary magnetization control layer is removed. Generally, since the exchange coupling strength depends on a remaining thickness of the auxiliary magnetization control layer, the inventor of the present invention also investigated forming the CoFe layer thicker in advance. However, the CoFe layer does not have a desirable shielding characteristic (a coercivity of NiFe is approximately 1 Oe, while on the other hand, the coercivity of CoFe is approximately 8 Oe). It may deteriorate the shielding characteristic and actually increase the read gap.

According to the present invention, at least the auxiliary magnetization control layer including a CoZrTa layer is laminated above the upper exchange coupling layer. Since CoZrTa has a sufficient shielding characteristic (the coercivity is approximately 3 Oe), the CoZrTa can be used as a shield film as a substitute for the NiFe layer. Moreover, since CoZrTa does not include Ni, even if there is the CoFe layer beneath its layer, Ni is not implanted to the CoFe layer, and a decrease of the exchange coupling strength can be prevented. This means that the auxiliary magnetization control layer does not necessarily require a thicker film thickness in order to keep the exchange coupling strength (namely, a thick auxiliary magnetization control layer is not required).

As described above, using CoZrTa maintains the exchange coupling strength of the upper magnetization control layer and suppresses the required remaining thickness of the auxiliary magnetization control layer. Accordingly, the initial film thickness of the auxiliary magnetization control layer can be decreased, and restrictions with respect to the TPI of the head can be reduced.

The above-mentioned object, as well as other objects, characteristics, and advantages of the present invention will be described below in more detail with reference to attached drawings illustrating an embodiment of the present invention.

DETAILED DESCRIPTION OF THE INVENTION

Figure 1:
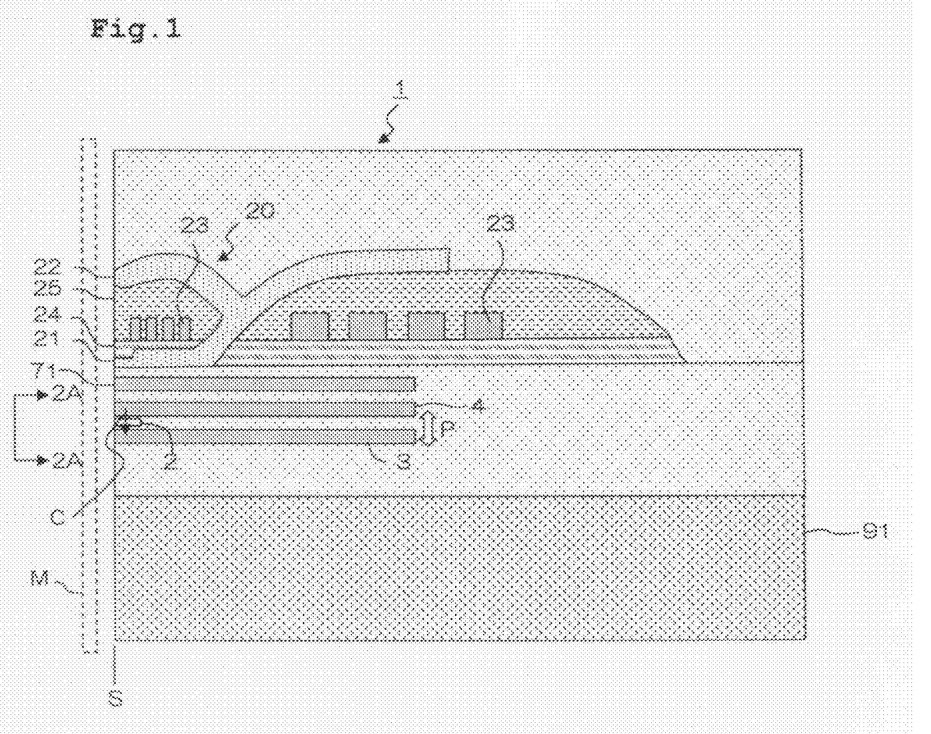
FIG. 1 is a side sectional view of a thin film magnetic head of one embodiment of the present invention.
Figure 2A:
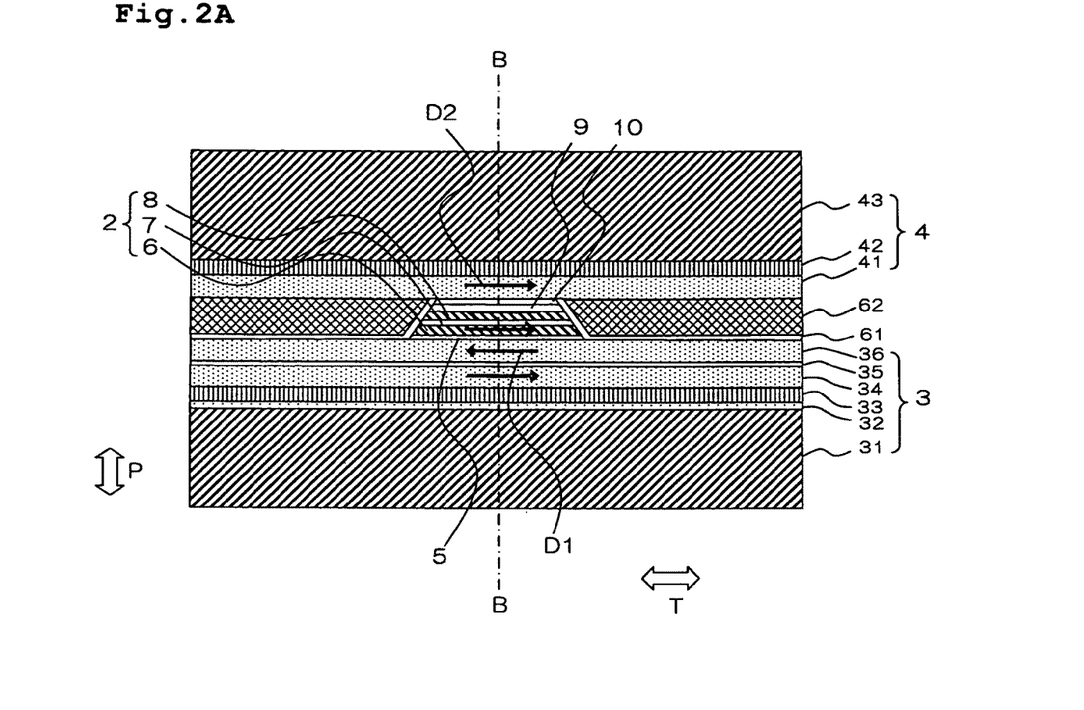
FIG. 2A is a side view of a reproducing element part of the thin film magnetic head seen from a 2A-2A direction in FIG. 1.
Figure 2B:
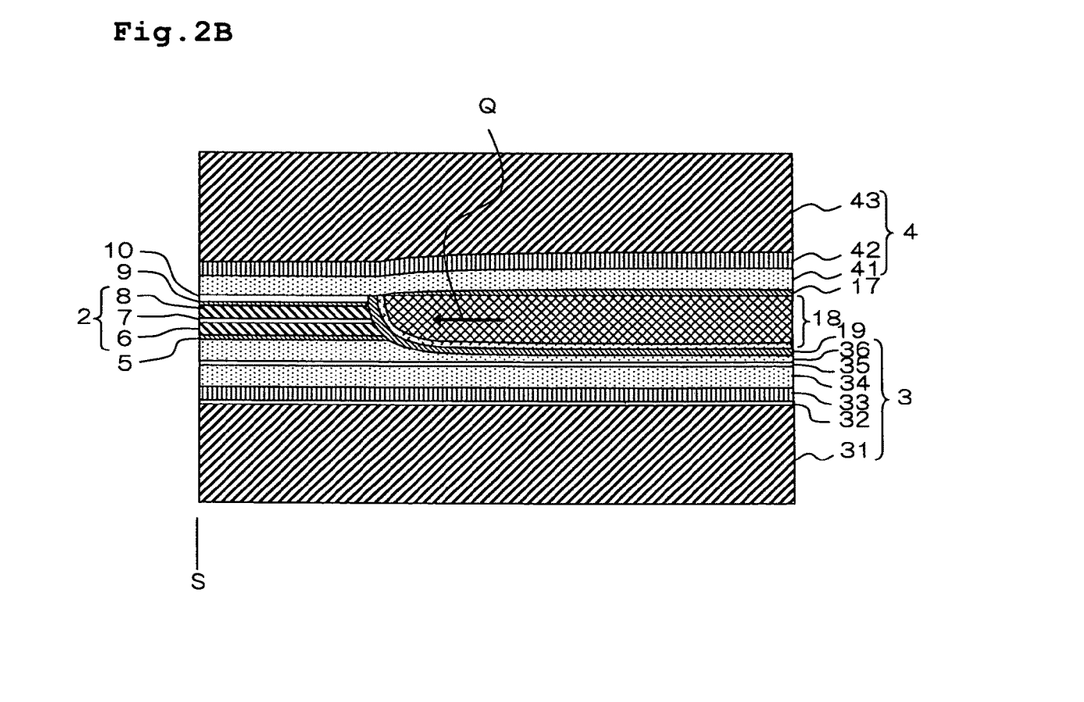
FIG. 2B is a sectional view of the reproducing element part of the thin film magnetic head seen from the same direction as FIG. 1.

Hereafter, a thin film magnetic head of embodiments of the present invention will be explained with reference of the drawings. FIG. 1 is a side sectional view of the thin film magnetic head of the present embodiment of the present invention. FIG. 2A is a side view of a reproducing element part of the thin film magnetic head seen from a 2A-2A direction in FIG. 1, i.e., from an air bearing surface (ABS) S. FIG. 2B is a sectional view of the reproducing element part of the thin film magnetic head seen from the same direction as FIG. 1 is shown. The ABS S is a surface of the thin film magnetic head 1 that is opposite to a recording medium M.

The thin film magnetic head 1 is a current perpendicular to plane (CPP) type in which a sense current flows in an orthogonal direction with respect to a film surface of the MR stack 2 (a film surface orthogonal direction P), including a MR stack 2 and lower and upper shield layers 3 and 4 arranged in a manner of sandwiching the MR stack 2 in the film surface orthogonal direction P of the MR stack 2. Table 1 shows film configurations of the MR stack 2 and the lower and upper shield layers 3 and 4, i.e., film configurations taken along line B-B of FIG. 2A. The table shows configurations in a bottom up direction and in a laminated order that is from the lower shield layer 3 to the upper shield layer 4.

TABLE 1

| Layer Configuration | | Composition | Film Thickness (nm) |
|---|---|---|---|
| Upper Shield Layer 4 | Upper Shield Main Layer 43 | NiFe | 1000~2000 |
| | Upper Antiferromagnetic Layer 42 | IrMn | 6 |
| | Upper Magnetization Control Layer 41 | $Co_{90}Fe_{10}$ | 2 |
| | | NiFe | 3 |
| Auxiliary Magnetization Control Layer 10 | | CoZrTa | 1.5~3.1 |
| | | CoFe | 1 |
| | Upper Exchange Coupling Layer 9 | Ru | 0.8 |
| MR Stack 2 | Upper Magnetization Free Layer 8 <Table 2> | NiFe | 3 |
| | | CoFeB | 1 |
| | | $Co_{30}Fe_{70}$ | 1 |
| | Non-magnetic Intermediate Layer 7 | MgO | 3 |
| | Lower Magnetization Free Layer 6 | $Co_{30}Fe_{70}$ | 1 |
| | | CoFeB | 1 |
| | | NiFe | 3 |
| | Lower Exchange Coupling Layer 5 | Ru | 0.8 |
| Lower Shield Layer 3 | Lower Magnetization Control Layer 36 | $Co_{90}Fe_{10}$ | 1 |
| | | NiFe | 8 |
| | | $Co_{90}Fe_{10}$ | 1 |
| | Ru Layer 35 | Ru | 0.8 |
| | Intermediate Magnetic | $Co_{90}Fe_{10}$ | 1 |

TABLE 1-continued

| Layer Configuration | Composition | Film Thickness (nm) |
|---|---|---|
| Layer 34 | NiFe | 8 |
| | $Co_{90}Fe_{10}$ | 1 |
| Lower Antiferromagnetic Layer 33 | IrMn | 7 |
| Buffer Layer 32 | Ru | 2 |
| | Ta | 1 |
| Lower Shield Main Layer 31 | NiFe | 1000~2000 |

Referring to FIG. 2A and Table 1, the MR stack 2 includes a lower magnetization free layer 6 whose magnetization direction varies according to an external magnetic field, a non-magnetic intermediate layer 7, and an upper magnetization free layer 8 whose magnetization direction varies according to the external magnetic field. The lower magnetization free layer 6, the non-magnetic intermediate layer 7, and the upper magnetization free layer 8 are disposed in a contacting manner in a bottom-up order from a substrate 91 respectively. The lower magnetization free layer 6 is adjacently disposed to a lower exchange coupling layer 5. The upper magnetization free layer 8 is adjacently disposed to an upper exchange coupling layer 9. The MR stack 2 has a cross sectional trapezoidal shape that has a narrow upper portion, a wider lower portion, and inclined side slopes.

The lower magnetization free layer 6 is configured from NiFe/CoFeB/CoFe layers. The non-magnetic intermediate layer 7 is configured from an MgO layer. The upper magnetization free layer 8 is configured from CoFe/CoFeB/NiFe layers. In the specification, the designations A/B/C . . . indicate that the films A, B, C, and . . . are laminated in a bottom-up order from the substrate 91. The lower magnetization free layer 6 and the upper magnetization free layer 8 may be also formed of NiFe or CoFeB. The non-magnetic intermediate layer 7 may be formed of materials such as ZnO, $Al_2O_3$, AlN, $TiO_2$, or NiO. When a metal or a semiconductor made of, for example, ZnO is used for the non-magnetic intermediate layer 7, the thin film magnetic head 1 functions as a current perpendicular to plane-giant magneto-resistance (CPP-GMR) element. When an insulator made of, for example, MgO is used, the thin film magnetic head 1 functions as a tunneling magneto-resistance (TMR) element.

The lower exchange coupling layer 5 is disposed between the lower magnetization free layer 6 and the lower magnetization control layer 36 of the lower shield layer 3. The lower exchange coupling layer 5 generates a negative exchange coupling between the lower magnetization control layer 36 and the lower magnetization free layer 6. The lower exchange coupling layer 5 is a Ru layer with a film thickness of 0.8 nm in this embodiment. However, the lower exchange coupling layer 5 may be configured with other film configurations such that at least one Ru layer with the film thickness of 0.8 nm is inserted into a magnetic layer made of, for example, a CoFe layer. For example, the film configurations may be CoFe layer/Ru layer/CoFe layer, CoFe layer/Ru layer/CoFe layer/Ru layer/CoFe layer, or the like. With such a film configuration, since the magnetic layers are disposed in a manner of sandwiching and contacting a Ru layer, and are negatively exchange-coupled, an exchange magnetic field generated in the lower exchange coupling layer 5 is continuously transferred to each of the adjacent magnetic layers to reverse the magnetization direction back and forth. As a result, the exchange coupling is generated between the lower magnetization control layer 36 and the lower magnetization free layer 6. The above mentioned layer configurations are effective when it is necessary to set the read gap to a predetermined size.

Similarly, the upper exchange coupling layer 9 is disposed between the upper magnetization free layer 8 and the upper magnetization control layer 41 of the upper shield layer 4, and generates the negative exchange coupling between the upper magnetization control layer 41 and the upper magnetization free layer 8. The upper exchange coupling layer 9 is a Ru layer with a film thickness of 0.8 nm in the present embodiment. However, as with the lower exchange coupling layer 5, the upper exchange coupling layer 9 may be configured with the film configurations where at least one Ru layer with a film thickness of 0.8 nm is inserted into a magnetic layer of, for example, a CoFe layer. The number of the inserted Ru layers is determined such that a magnetization direction of the lower magnetization free layer 6 and a magnetization direction of the upper magnetization free layer 8 are antiparallel to each other when the bias magnetic field and the external magnetic field are not applied. For example, when both layer configurations of the lower exchange coupling layer 5 and the upper exchange coupling layer 9 are configured together with the three layer configuration, Ru layer/CoFe layer/Ru layer, or the five layer configuration, Ru layer/CoFe layer/Ru layer/CoFe layer/Ru layer, this required condition is fulfilled. In addition, in order to narrow the read gap, it is preferred that both the lower exchange coupling layer 5 and the upper exchange coupling layer 9 are configured with the Ru layer having a film thickness of 0.8 nm. According to the configuration shown in Table 1, the read gap is 14.6 nm, which is an extremely small value.

The auxiliary magnetization control layer 10 is disposed between the upper exchange coupling layer 9 and the upper shield layer 4. The auxiliary magnetization control layer 10 is configured with CoFe layer/CoZrTa layer in the example of Table 1. However, the auxiliary magnetization control layer 10 may also be configured with a three layer configuration, CoFe layer/CoZrTa layer/NiFe layer, or a single layer configuration of a CoZrTa layer. The detailed configuration and action of the auxiliary magnetization control layer 10 will be described afterward.

The lower shield layer 3 as well as the upper shield layer 4 acts as an electrode that applies the sense current C in the film surface orthogonal direction P of the MR stack 2. The lower shield layer is a lower shield that is positioned in a facing manner to the lower magnetization free layer 6, and the upper shield layer is an upper shield that is positioned in a facing manner to the upper magnetization free layer 8.

The lower shield layer 3 has a lower shield main layer 31 made of NiFe, a lower antiferromagnetic layer 33, an intermediate magnetic layer 34 exchange-coupled with the lower antiferromagnetic layer 33, and the lower magnetization control layer 36 that is mentioned above and positioned at the lower magnetization free layer 6 side. The lower antiferromagnetic layer 33 is positioned on the lower shield main layer 31 through a buffer layer 32, and is made of IrMn. A ruthenium (Ru) layer 35, having the film thickness of 0.8 nm, is disposed between the intermediate magnetic layer 34 and the lower magnetization control layer 36, and generates negative exchange coupling between the intermediate magnetic layer 34 and the lower magnetization control layer 36. In view of reducing a shield gap, it is advantageous that each of layers from the buffer layer 32 to the lower magnetization control layer 36 is disposed as a part of the lower shield layer. However, each of the layers may be disposed on the lower shield main layer 31 as a pillar body in the same manner as the MR stack 2.

The upper shield layer 4 is disposed on the opposite side to the substrate 91 with respect to the MR stack 2. The upper shield layer 4 has an upper shield main layer 43 made of NiFe, an upper antiferromagnetic layer 42, and the upper magnetization control layer 41. The upper antiferromagnetic layer 42 is positioned under the upper shield main layer 43 and is made of IrMn. The upper magnetization control layer 41, mentioned above, is positioned at the upper magnetization free layer 8 side of the upper shield layer 4. The upper magnetization control layer 41 and the upper antiferromagnetic layer 42 are exchange-coupled, and the magnetization direction of the upper magnetization control layer 41 is fixed in an antiparallel direction D2 that is opposite to the magnetized direction of the lower magnetization control layer 36 (the first direction D1). The first direction D1 is parallel to the ABS S, and is parallel to a film surface of the lower magnetization control layer 36. The lower antiferromagnetic layer 33 and the upper antiferromagnetic layer 42 may be formed of an alloy, such as, IrMn, Fe—Mn, Ni—Mn, Pt—Mn, or Pd—Pt—Mn, and may be formed of a combination of the above alloys including IrMn.

As described above, the magnetization directions of the upper magnetization control layer 41 and the lower magnetization control layer 36 are antiparallel so that the read gap is minimized with a configuration in which each of the lower exchange coupling layer 5 and the upper exchange coupling layer 9 is made with the Ru layer having a film thickness of 0.8 nm. Specifically, in order to function as a reproducing element, it is necessary that the magnetization direction of the lower magnetization free layer 6 and the magnetization direction of the upper magnetization free layer 8 be antiparallel under the state that the bias magnetic field and the external magnetic field are not applied. When the magnetization directions of the lower magnetization control layer 36 and the upper magnetization control layer 41 are fixed in an antiparallel direction to each other, it become possible that both the lower exchange coupling layer 5 and the upper exchange coupling layer 9 are configured with the Ru layers having a film thickness of 0.8 nm. However, the magnetization directions of the upper magnetization control layer 41 and lower magnetization control layer 36 might be parallel. Namely, as long as the magnetization direction of the lower magnetization free layer 6 and the magnetization direction of the upper magnetization free layer 8 are antiparallel, the configuration works. The magnetization direction of the lower magnetization free layer 6 is due to the magnetic coupling between the lower magnetization free layer 6 and the lower magnetization control layer 36 and the magnetization direction of the upper magnetization free layer 8 is due to the magnetic coupling between the upper magnetization free layer 8 and the upper magnetization control layer 41.

Each of the magnetization directions of the lower magnetization control layer 36 and upper magnetization control layer 41 are determined by the magnetization directions of the lower antiferromagnetic layer 33 and the upper antiferromagnetic layer 42, respectively. On the other hand, the magnetization directions of the lower antiferromagnetic layer 33 and the upper antiferromagnetic layer 42 are determined by a direction of a magnetic field during a heat treatment process in a magnetic field. Therefore, the magnetization directions of the lower antiferromagnetic layer 33 and the upper antiferromagnetic layer 42 are preferably arranged in the same direction during the producing processes. Accordingly, the intermediate magnetic layer 34 is disposed between the lower antiferromagnetic layer 33 and the lower magnetization control layer 36, and negative exchange coupling is generated between the intermediate magnetic layer 34 and the lower magnetization control layer 36. With the above configuration, the magnetization directions of the lower antiferromagnetic layer 33 and the upper antiferromagnetic layer 42 are arranged in the same direction, and the magnetization directions of the lower magnetization control layer 36 and the upper magnetization control layer 41 are in an antiparallel direction. Additionally, it is apparent that a similar effect may be obtained when the intermediate magnetic layer 34 is disposed between the upper antiferromagnetic layer 42 and the upper magnetization control layer 41.

As shown in FIG. 2B, on the rear side of the MR stack 2, seen from the ABS S, a bias magnetic field application layer 18 is disposed through an insulating layer 19 made of $Al_2O_3$. The bias magnetic field application layer 18 is a hard magnetic film configured with a Cr layer/CoPt layer. The CoPt layer mainly applies a bias magnetic field in an orthogonal direction Q to the ABS S to the MR stack 2. The bias magnetic field application layer 18 may be made of CoCrPt. The insulating layer 19 prevents the sense current from flowing into the bias magnetic field application layer 18. It is preferred to dispose a cap layer 17 made of Cr on the bias magnetic field application layer 18.

Referring again to FIG. 2A, insulating layers 62 made of $Al_2O_3$ are formed on both sides of the track width T of the MR stack 2 through a bottom gap layer 61. Disposing the insulating layers 62 in such a manner concentrates the sense current flowing along the film surface orthogonal direction P into the MR stack 2.

Referring back to FIG. 1, a writing part 20 is disposed above the upper shield layer 4 through an interelement shield layer 71 formed by, for example, a sputtering method. The writing part 20 has a configuration for the so-called perpendicular magnetic recording. A magnetic pole layer for writing is configured with a main magnetic pole layer 21 and an auxiliary magnetic pole layer 22. These magnetic pole layers 21 and 22 are formed by a frame plating method or the like. The main magnetic pole layer 21 is made of FeCo, and is exposed on the ABS S in an almost orthogonal direction to the ABS S. A coil layer 23 is wound around the main magnetic pole layer 21, and extends over a gap layer 24 that is made of an insulating material. The magnetic flux is induced to the main magnetic pole layer 21 by the coil layer 23. The coil layer 23 is formed by a frame plating method or the like. The magnetic flux is guided through the inside of the main magnetic pole layer 21 and is emitted toward the recording medium from the ABS S. The main magnetic pole layer 21 is narrowed in the vicinity of the ABS S not only in the film surface orthogonal direction P but also in the track width direction T (a direction that is orthogonal to the paper surface of FIG. 1; see FIG. 2 as well). Therefore, it generates a minute and strong writing magnetic field that is suitable for high recording density.

The auxiliary magnetic pole layer 22 is a magnetic layer that is magnetically connected with the main magnetic pole layer 21. The auxiliary magnetic pole layer 22 is a magnetic pole layer with a film thickness of approximately 0.01 to 0.5 μm and is formed by an alloy that is made of, for example, either two or three of the following materials: Ni; Fe; and Co. The auxiliary magnetic pole layer 22 is branched from the main magnetic pole layer 21 and faces the main magnetic pole layer 21 through a gap layer 24 and a coil insulating layer 25 on the ABS S side. The edge portion of the auxiliary magnetic pole layer 22 on the side of the ABS S forms a trailing shield part of which the layer cross section (area) in the edge portion is larger than other portions of the auxiliary magnetic pole layer 22. Because the auxiliary magnetic pole layer 22 is disposed in this manner, the magnetic field gradient between the auxiliary magnetic pole layer 22 and the main magnetic pole layer 21 is precipitous in the vicinity of the ABS S. As a result, signal output jitter is small, and error rate of reading is small.

Next, an operation principle on how the thin film magnetic head of the present embodiment reads magnetic information recorded on the recording medium is explained below. As arrows shown in FIG. 2A, the intermediate magnetic layer 34 is magnetized in a right-pointing direction in the figure by exchange coupling with the lower (first) antiferromagnetic layer 33. The lower magnetization control layer 36 is magnetized in a left-pointing direction (D1) in the figure by exchange coupling with the intermediate magnetic layer 34. Similarly, the upper magnetization control layer 41 is magnetized in the right-pointing direction (D2) in the figure by exchange coupling with the upper (second) antiferromagnetic layer 42.

Figure 3:
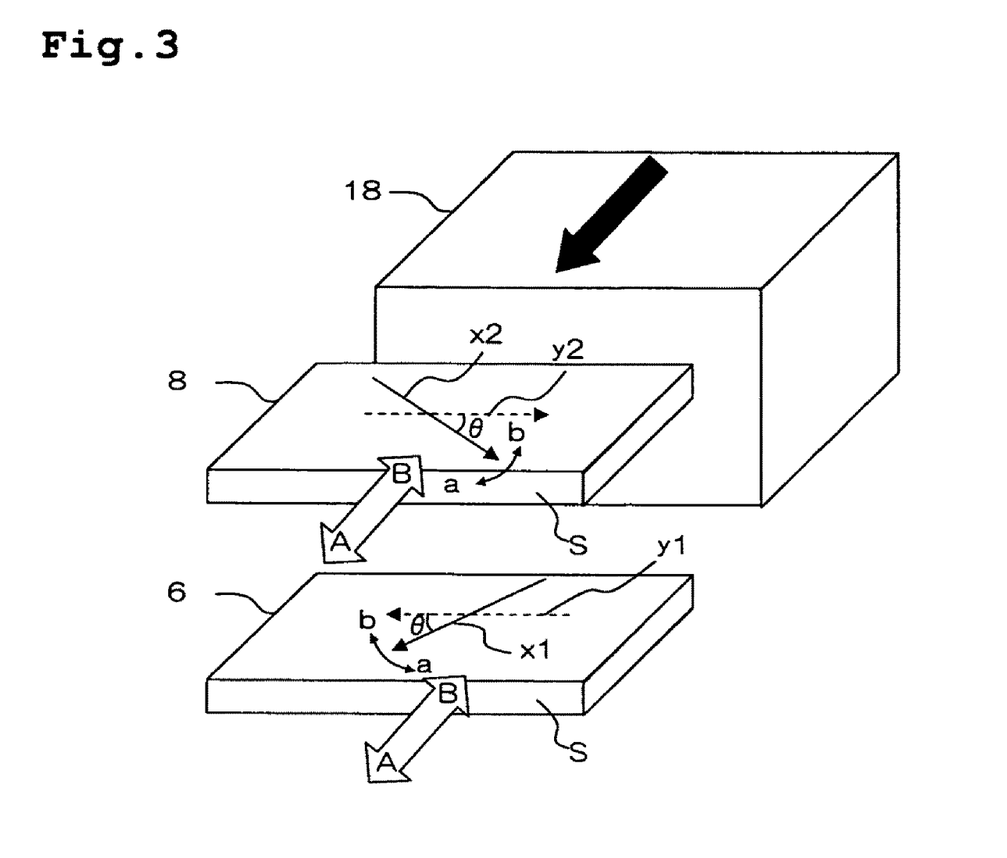
FIG. 3 is a schematic view illustrating operation principles of the thin film magnetic head of the present invention.
Figure 4:
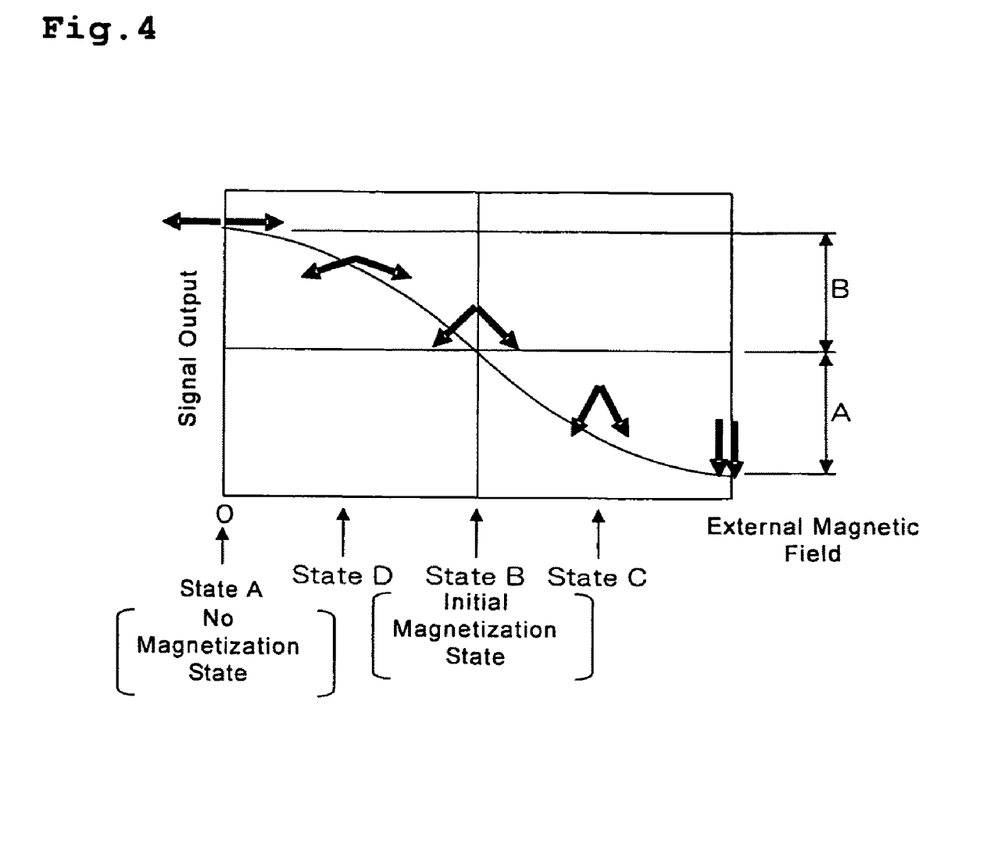
FIG. 4 is a pattern diagram illustrating a relationship between magnetic field intensity applied to upper and lower magnetization free layers and a signal output.

Initially, a hypothetical state is assumed in which neither a bias magnetic field nor an external magnetic field is applied. Under the hypothetical state, the lower magnetization free layer 6 is magnetized in the right-pointing direction in FIG. 2A by exchange coupling with the lower exchange coupling layer 5, and the upper magnetization free layer 8 is magnetized in the left-pointing direction in FIG. 2A by exchange coupling with the upper exchange coupling layer 9. FIG. 3 is a pattern diagram (or schematic view) showing magnetizations of the upper and lower magnetization free layers. The magnetization directions of the lower magnetization free layer 6 and the upper magnetization free layer 8 are shown by dashed arrows y1 and y2. FIG. 4 is a pattern diagram showing the relationship between a magnetic field to be applied and a signal output of the reproducing element. The above hypothetical state corresponds to a state A (no magnetization state). In addition, arrows in FIG. 4 schematically show magnetization directions of the two magnetization free layers 6 and 8 in each state.

Actually, since the bias magnetic field application layer 18 is disposed on back sides of the lower and upper magnetization free layers 6 and 8, the lower and upper magnetization free layers 6 and 8 receive a magnetic field in the orthogonal direction to the ABS S as shown with a black bold arrow in FIG. 3. As a result, the magnetization directions of the lower and upper magnetization free layers 6 and 8, as shown by solid arrows x1 and x2 in FIG. 3, rotate for a predetermined angle θ in reverse rotating directions to each other from the dashed arrows y1 and y2, and are ideally orthogonally positioned to each other (State B in FIG. 4; initial magnetization state).

In the initial magnetization state, when an external magnetic field is applied as shown by outline arrows in the drawings, the magnetization directions of the lower and upper magnetization free layers 6 and 8 respectively rotate in opposite rotating directions according to the external magnetic field direction. Specifically, when the external magnetic field is applied in direction A in the drawing, the magnetization directions (solid arrows x1 and x2) of the lower and upper magnetization free layers 6 and 8 rotate in direction a in the drawing (state C in FIG. 4). When the external magnetic field is applied in direction B in the drawing, the magnetization directions of the lower and upper magnetization free layers 6 and 8 rotate in direction b in the drawing (state D in FIG. 4). As described above, the relative angle between the magnetization directions of the lower and upper magnetization free layers 6 and 8 varies according to the external magnetic field, so that a resistance value of the sense current varies based on a magnetoresistive effect. The thin magnetic head 1 can detect direction and strength of the external magnetic field by using this principle.

Figure 5A:
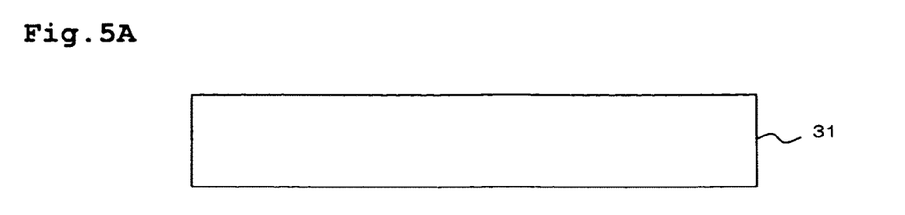
FIG. 5A to 5E are pattern diagrams illustrating a part of manufacturing process of the thin film magnetic head of the present invention.
Figure 5B:
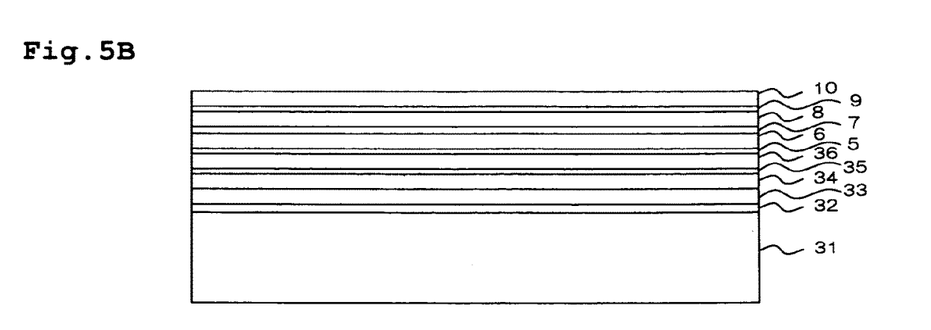
Figure 5C:
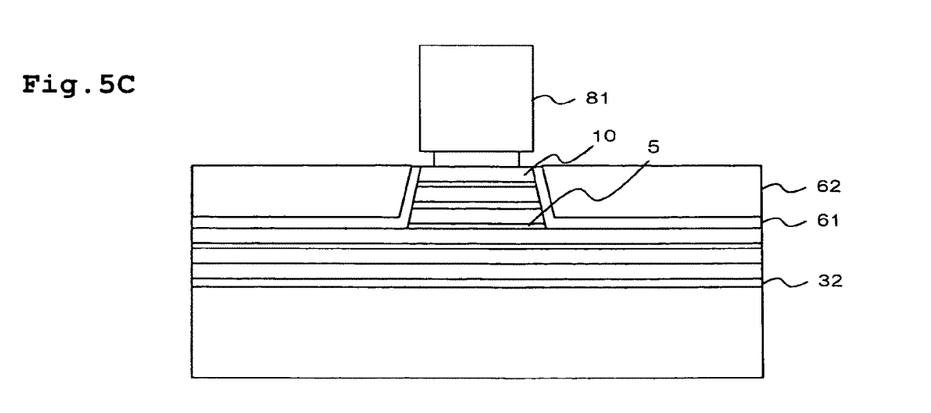
Figure 5D:
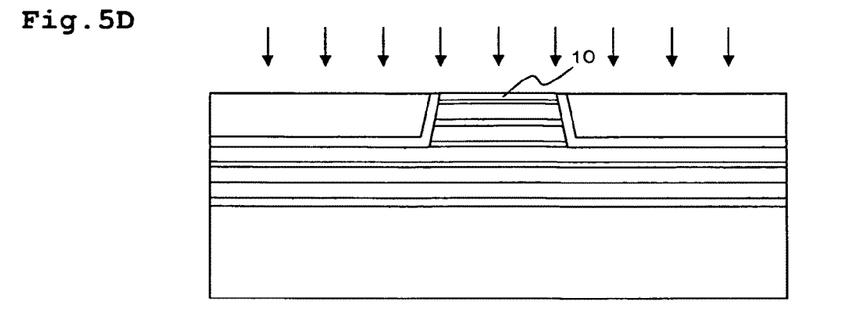
Figure 5E:
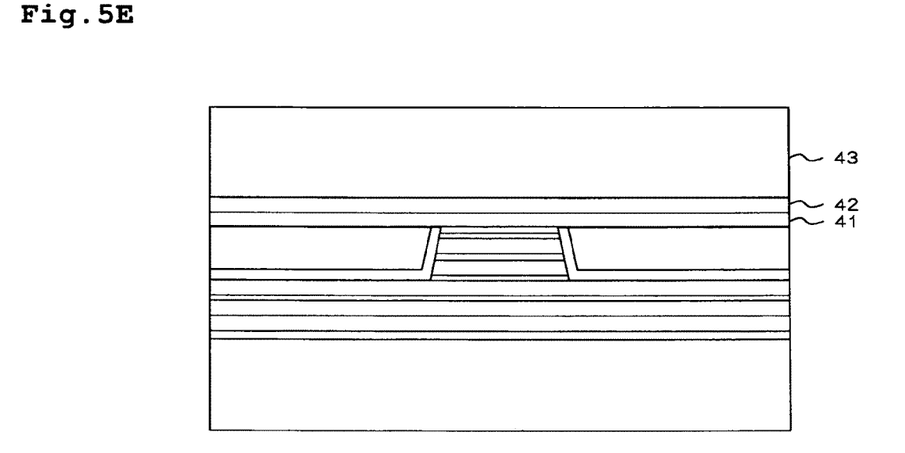

The thin film magnetic head of the present embodiment is manufactured by methods described below. Initially, as shown in FIG. 5A, the lower shield main layer 31 is formed on the substrate 91. Next, as shown in FIG. 5B, each of the layers from the buffer layer 32 to the lower magnetization control layer 36 that are shown in Table 1 is formed by sputtering on the lower shield main layer 31, and the lower shield layer 3 is formed. On the lower shield layer 3, each of layers from the lower exchange coupling layer 5 to the upper exchange coupling layer 9 is formed, and the auxiliary magnetization control layer 10 including a CoZrTa layer is laminated on the upper exchange coupling layer 9. Next, as shown in FIG. 5C, a resist 81 is formed, and both side portions in the track width direction of each of the layers from the lower exchange coupling layer 5 to the auxiliary magnetization control layer 10 are cut off using the resist 81 as a mask. The portions that were cut off are plugged by the insulting layers 62 through the bottom gap layers 61. The resist 81 is lift-off. Next, rear surfaces, seen from the ABS S, of the MR stack 2 and the insulating layer 62 are milled using the resist (not shown) as a mask. Therefore, each of the layers from the lower exchange coupling layer 5 to the auxiliary magnetization control layer 10 is formed in pillar shape. After that, in the space that is removed by milling, the bias magnetic field application layer 18 is formed through the insulating layer 19. FIG. 2B shows this state. The resist is lift-off. As shown in FIG. 5D, a surface layer portion including an upper surface of the auxiliary magnetization control layer 10 is removed by ion beam etching. As shown in FIG. 5E, each of the layers 41-43 of the upper shield layer 4 whose film configuration is shown in Table 1 is formed. Then, the writing part 20 described above is formed in the conventional method.

Figure 6:
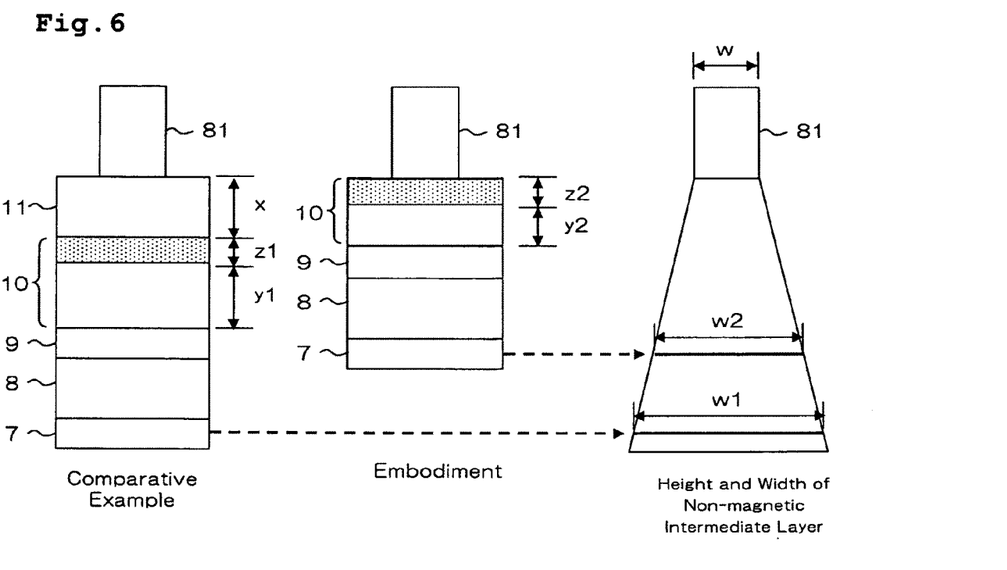
FIG. 6 is a pattern diagram illustrating an action of an auxiliary magnetization control layer.

Next, actions of the auxiliary magnetization control layer 10 will be explained. FIG. 6 is a partially enlarged diagram under the state shown in FIGS. 5B and 5C in which a comparative example of the DFL configuration and an embodiment are shown. The comparative example is one of the film configurations described in the BACKGROUND OF THE INVENTION. In the configuration of the comparative example, layers are laminated in a bottom up direction in the following order: non-magnetic intermediate layer 7; upper magnetization free layer 8; upper exchange coupling layer 9; auxiliary magnetization control layer 10; and non-magnetic layer (the cap layer) 11, and the resist 81 is formed on the non-magnetic layer 11. The embodiment is configured with the above-described film configuration. In the film configuration of the embodiment, layers are laminated in the bottom up direction in the following order: non-magnetic intermediate layer 7; upper magnetization free layer 8; upper exchange coupling layer 9; and auxiliary magnetization control layer 10, and the resist 81 is formed on the auxiliary magnetization control layer 10.

In the rightmost figure of FIG. 6, the heightwise positions of the non-magnetic intermediate layer 7 of each case are shown in a state shown in FIG. 5C. The non-magnetic intermediate layer 7 is set as a reference so that the width of the non-magnetic intermediate layer 7 in the track direction substantially corresponds with an average width in the track direction of the upper magnetization free layer 8 and the lower magnetization free layer 6. As the above description, when a pillar forming is processed by, for example, the ion beam etching that uses a photoresist as a mask, the film is formed such that its cross-section is in a diagrammatic trapezoidal shape. When the width w in the track width direction of the photoresist is set at a constant value, the width of the pillar body in the non-magnetic intermediate layer 7 is proportional to the distance from a bottom surface of the photoresist to the non-magnetic intermediate layer 7. Specifically, in the case of the comparative example, the upper exchange coupling layer 9, the auxiliary magnetization control layer 10, and the non-magnetic layer 11 are disposed above the non-magnetic intermediate layer 7, so that the distance between the bottom surface of the photoresist and the non-magnetic intermediate layer 7 is relatively long. Accordingly, the width w1 in the track direction of the non-magnetic intermediate layer 7 is relatively wide. On the other hand, in the case of the embodiment, only the upper exchange coupling layer 9 and the auxiliary magnetization control layer 10 are disposed above the non-magnetic intermediate layer 7, so that the distance between the bottom surface of the photoresist and the non-magnetic intermediate layer 7 is relatively short. Accordingly, the width w2 in the track direction of the non-magnetic intermediate layer 7 of the embodiment is relatively narrow.

In the BACKGROUND OF INVENTION, the case in which the non-magnetic layer 11 is not disposed was described. In this case, an oxidized surface layer portion of the auxiliary magnetization control layer 10 is necessarily removed. It may be understood that the case is the same as the comparative example, if the surface layer portion of the auxiliary magnetization control layer 10 is replaced with the non-magnetic layer 11.

In order to completely remove the non-magnetic layer 11 or the surface layer portion of the auxiliary magnetization control layer 10, the constant width of the auxiliary magnetization control layer 10 has to be further trimmed. When the auxiliary magnetization control layer 10 is configured with CoFe layer/NiFe layer, in particular, because of implantation of Ni, there is the possibility to decrease an action that increases the exchange coupling strength of the CoFe layer. In the present embodiment, the NiFe layer is replaced with a CoZrTa layer that does not include Ni, so that Ni is not implanted to the CoFe layer, and it prevents the exchange coupling strength from decreasing.

Figure 7:
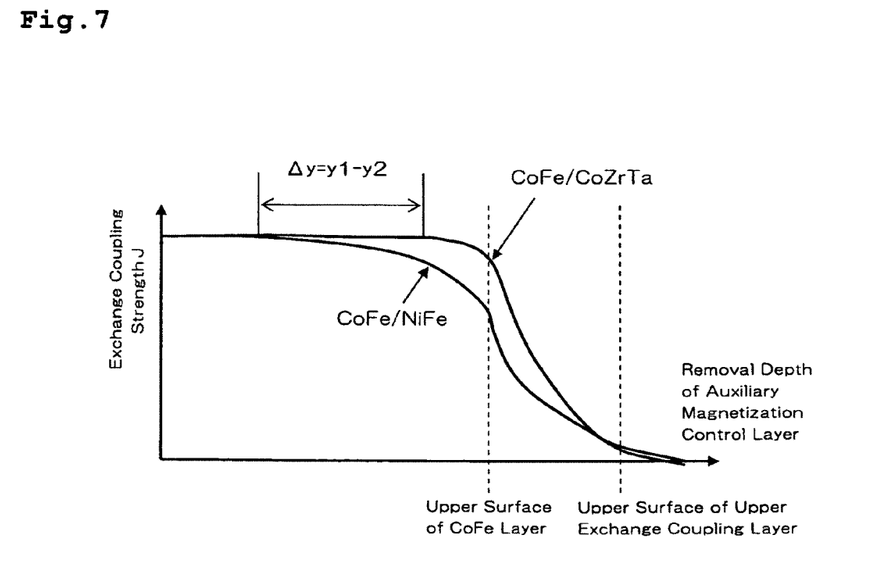
FIG. 7 is a schematic graph illustrating a relationship between a removal depth of a surface layer portion of the auxiliary magnetization control layer and an exchange coupling strength.

FIG. 7 is a schematic graph whose horizontal axis shows a removal depth of the auxiliary magnetization control layer 10 and whose vertical axis shows exchange coupling strength. As trimming the surface layer portion of the auxiliary magnetization control layer configured with CoFe layer/NiFe layer proceeds (in other words, moving rightward along the curved lines), when the removal depth reaches a certain depth, the exchange coupling strength starts to decrease and keeps decreasing the exchange coupling strength afterword. On the other hand, when the auxiliary magnetization control layer is configured with a CoFe layer/CoZrTa layer, trimming the surface layer portion does not cause the exchange coupling strength to decrease for a while. When the surface layer portion is further trimmed, the exchange coupling strength finally starts to decrease. However, the decreasing of the exchange coupling strength is less than the case of CoFe layer/NiFe layer. This means that the exchange coupling strength is difficult to weaken, even if the auxiliary magnetization control layer 10 is configured with CoFe layer/CoZrTa layer and the removal depth of the surface layer portion of the auxiliary magnetization control layer 10 is wide. In other words, when a necessary remaining film thickness of the auxiliary magnetization control layer 10 configured with the CoFe layer/NiFe layer is designated as y1, and when a necessary remaining film thickness of the auxiliary magnetization control layer 10 configured with the CoFe layer/CoZrTa layer is designated as y2, a relationship of y1>y2 is formed. The removal depths z1 and z2 of the auxiliary magnetization control layer 10 are necessary to completely remove the surface layer portion of the non-magnetic layer 11 and the auxiliary magnetization control layer 10. These removal depths z1 and the z2 are comparable in the comparative example and the embodiment, so that an initial film thickness of the auxiliary magnetization control layer 10 configured with the CoFe layer/CoZrTa layer can be reduced by only $\Delta y = y1 - y2$.

In the present embodiment, the film thickness that corresponds with a sum of following (1) plus (2) is reduced. Thereby, the width in the track direction of the MR stack 2 is reduced, which corresponds to the reduced film thickness. Herein, (1) represents the film thickness x of the non-magnetic layer 11 or the film thickness of the surface layer oxidation portion of the auxiliary magnetization control layer 10 that is the same thickness as the film thickness x, and (2) represents a difference $\Delta y$ of the necessary removal film thickness of the auxiliary magnetization control layer 10 ($\Delta y = y1 - y2$). Therefore, the present embodiment is favorable from the viewpoint of restriction of the TPI.

As described above, the film configuration of the auxiliary magnetization control layer 10 may be configured not only with the CoFe layer/CoZrTa layer but also with the CoFe layer/CoZrTa layer/NiFe layer. A NiFe layer has not only excellent shield performance but also good compatibility with the photoprocess. Moreover, the CoZrTa layer is positioned between the CoFe layer and the NiFe layer, so that implantation of Ni is absorbed at the CoZrTa layer and has minimal negative effects on the CoFe layer.

The auxiliary magnetization control layer 10 may be also configured with a single CoZrTa layer. The CoZrTa layer itself is excellent for the shield performance and has a characteristic of increasing the exchange coupling strength. In the case of the single layer configuration of the CoZrTa layer, the implantation of Ni toward the CoFe layer does not occur. Therefore, as described afterwards, the single layer configuration of the CoZrTa layer has a high tolerance with respect to the ion beam etching and is highly advantageous in reducing the necessary removal film thickness, and is a highly favorable embodiment with respect to the TPI.

Embodiments

An effect that a CoZrTa layer had on exchange coupling strength was examined. Specifically, a relationship between a remaining film thickness and the exchange coupling strength was examined where film configurations of an auxiliary magnetization control layer were as follows: CoFe layer/CoZrTa layer (Embodiment 1); CoFe layer/CoZrTa layer/NiFe layer (Embodiment 2); CoZrTa single layer (Embodiment 3); and CoFe layer/NiFe layer (Comparative Example). A film configuration is shown in Table 2.

TABLE 2

| Cap Layer | Ta | 2 |
|---|---|---|
| | Ru | 2 |
| Upper Magnetization Control Layer 41 | $Co_{90}Fe_{10}$ | 2 |
| | NiFe | 3 |
| Auxiliary Magnetization Control Layer 10 | (see below) | |
| Upper Exchange Coupling Layer 9 | Ru | 0.8 |
| Upper Magnetization Free Layer 8 | NiFe | 3 |
| | CoFeB | 1 |
| | $Co_{30}Fe_{70}$ | 1 |
| Buffer Layer 32 | Ru | 2 |
| | Ta | 1 |
| Si Substrate | Si | — |

Film thickness of the auxiliary magnetization control layer was as follows. In the case of the CoFe layer/CoZrTa layer, an initial film thickness of the CoFe layer was 1 nm, and an initial film thickness of the CoZrTa layer was 8 nm. In the case of the CoFe layer/CoZrTa layer/NiFe layer, an initial film thickness of the CoFe layer was 1 nm, an initial film thickness of the CoZrTa layer was 1 nm, and an initial film thickness of the NiFe layer was 7 nm. In the case of the CoZrTa layer, an initial film thickness of the CoZrTa layer was 9 nm. Similarly, in the case of CoFe layer/NiFe layer, an initial film thickness of the CoFe layer was 1 nm, and an initial film thickness of the NiFe layer was 8 nm. In each case, the auxiliary magnetization control layer was trimmed by ion beam etching, and the exchange coupling strength was obtained by specifying the remaining film thickness of the auxiliary magnetization control layer as a parameter and using a vibrating sample magnetometer (VSM). A cap layer was disposed to prevent an upper magnetization control layer from oxidization.

Figure 8:
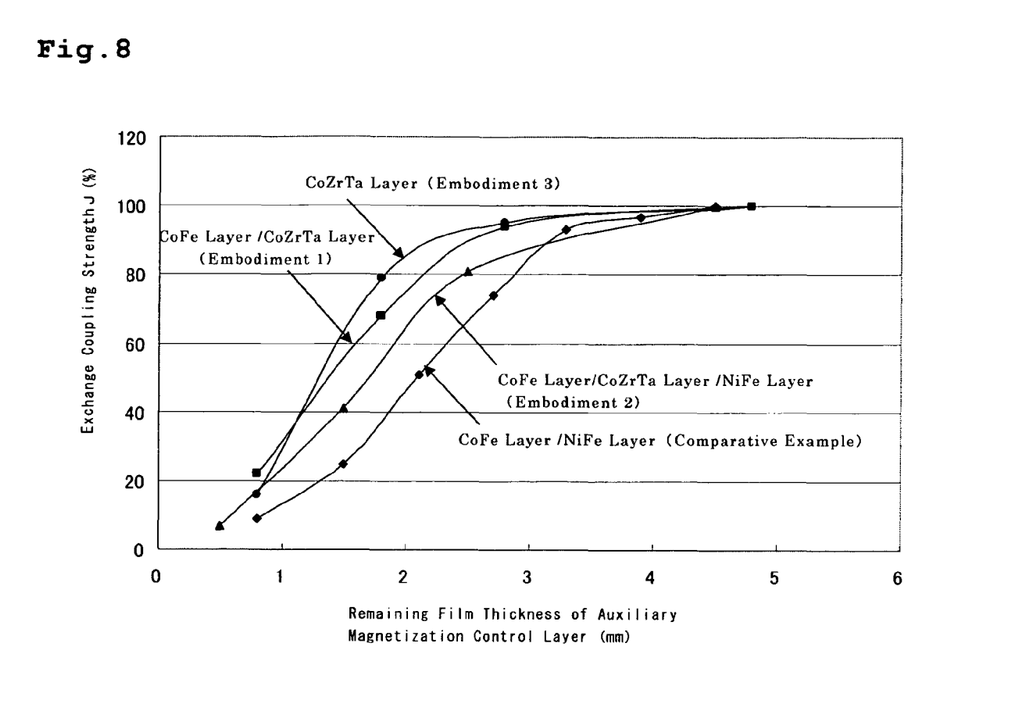
FIG. 8 is a graph illustrating a relationship between a remaining depth of the auxiliary magnetization control layer and the exchange coupling strength according to embodiments and a comparative example.

FIG. 8 is a graph showing the relationship between the remaining film thickness of the auxiliary magnetization control layer and the exchange coupling strength, which were obtained by the previously described method. The horizontal axis of FIG. 8 is different from that of FIG. 7, as the horizontal axis shows the remaining film thickness of the auxiliary magnetization control layer. In each case, the exchange coupling strength of a state is regulated as the exchange coupling strength of 100%. The state is an initial state of the auxiliary magnetization control layer, or a state where the auxiliary magnetization control layer is minimally trimmed. When the exchange coupling strength drastically decreased from the initial value during the process of trimming the auxiliary magnetization control layer, a large dispersion of the exchange coupling strength easily occurs, which is not preferred in the view of yield rate. That is why the regulating process for the graph was performed. Ideally, it is desirable that the exchange coupling strength does not decrease at all. However, herein, a decrease of approximately 10% was set as a practical tolerance range. In other words, the remaining film thickness that can keep the exchange coupling strength of 90% with respect to the initial value was set as an acceptable minimum film thickness. With reference to FIG. 8, in the Comparative Example, it is recognized that the exchange coupling strength decreases significantly as the remaining film thickness of the auxiliary magnetization control layer decreases. On the other hand, in each Embodiment, even when the remaining film thickness of the auxiliary magnetization control layer decreases, the decrease of the exchange coupling strength is limited. Accordingly, it is recognized that these embodiments have a high tolerance with respect to the ion beam etching. The remaining film thickness of the auxiliary magnetization control layer that satisfies the tolerance was 2.5 nm in case of the CoFe layer/CoZrTa layer, 2.9 nm in case of the CoFe layer/CoZrTa layer/NiFe layer, and 2.2 nm in case of the CoZrTa layer. In addition, in the Comparative Example, the remaining film thickness to satisfy the tolerance was 3.2 nm.

On the other hand, a significant upper limit value was not set with respect to the film thickness of the auxiliary magnetization control layer. However, when the remaining film thickness is relatively too large, a restriction with respect to TPI increases, so that the advantage of the invention of the present application will not be obtained. In order to be less than the remaining film thickness (4.2 nm) of the CoFe layer/NiFe layer of the Comparative Example, the film thickness of the auxiliary magnetization control layer was set at approximately 4.1 nm as an upper limit value in each Embodiment. These conditions are shown in Table 3.

TABLE 3

| | Example 1 | | Example 2 | |
|---|---|---|---|---|
| | Film Configuration and Remaining Film Thickness | Total (nm) | Film Configuration and Remaining Film Thickness | Total (nm) |
| Lower Limit Remaining Film Thickness (nm) | CoFe 1.0/ CoZrTa 1.5 | 2.5 | CoFe 1.0/ CoZrTa 1.0/ NiFe 0.9 | 2.9 |
| Upper Limit Remaining Film Thickness (nm) | CoFe 1.0/ CoZrTa 3.1 | 4.1 | CoFe 1.0/ CoZrTa 1.0/ NiFe 2.1 | 4.1 |

| | Example 3 | | Comparative Example | |
|---|---|---|---|---|
| | Film Configuration and Remaining Film Thickness | Total (nm) | Film Configuration and Remaining Film Thickness | Total (nm) |
| Lower Limit Remaining Film Thickness (nm) | CoZrTa 2.2 | 2.2 | CoFe 1.0/NiFe 2.2 | 3.2 |
| Upper Limit Remaining Film Thickness (nm) | CoZrTa 4.1 | 4.1 | CoFe 1.0/NiFe 3.2 | 4.2 |

Figure 9:
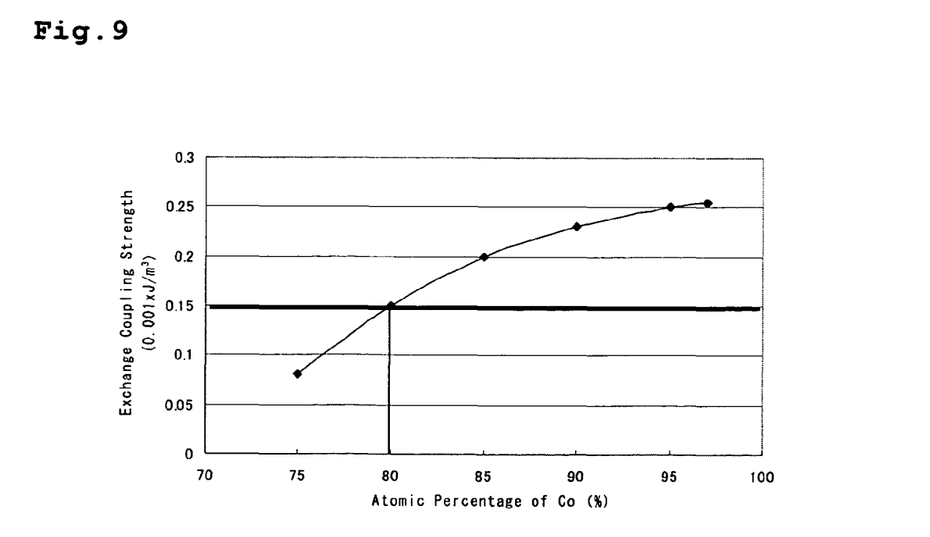
FIG. 9 is a graph illustrating a relationship between an atomic percentage of Co of a CoZrTa layer and the exchange coupling strength.

Next, an appropriate range of an atomic percentage of Co in the CoZrTa layer was obtained. Co has an action to increase the exchange coupling strength, so that a lower limit value of the atomic percentage of Co was determined to ensure a lower limit value of the exchange coupling strength. According to the case of the CoZrTa layer, a relationship between the atomic percentage of Co and the exchange coupling strength was examined. Each atomic percentage of other elements (Zr and Ta) of the CoZrTa layer were set to be even to each other at the time that the atomic percentage of Co was changed. For example, when the atomic percentage of Co is 90%, the atomic percentages of Zr and Ta are 5%. The lower limit value of the exchange coupling strength was set as $0.15 \times 10^{-3}$ J/m³ in an empirical view. As shown in FIG. 9, it is desirable that the atomic percentage of Co is no less than 80%. In addition, also in the cases of the CoFe layer/CoZrTa layer and the CoFe layer/CoZrTa layer/NiFe layer, it is considered to make little difference in behavior of CoZrTa in the auxiliary magnetization control layer, so that the lower limit value of the atomic percentage of Co is almost the same.

Figure 10:
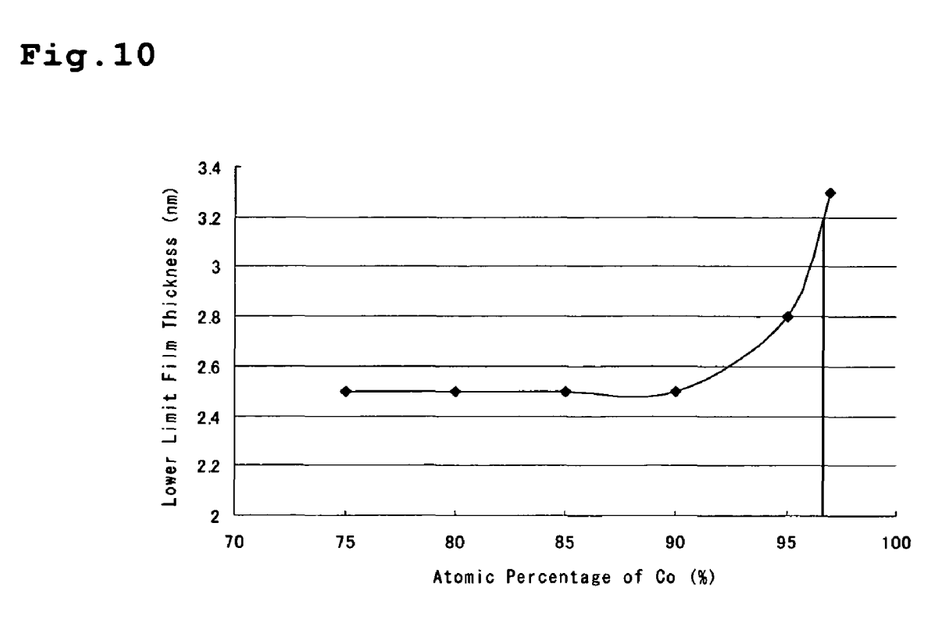
FIG. 10 is a graph illustrating a relationship between an atomic percentage of Co of a CoFe layer/CoZrTa layer and a film thickness lower limit value of the auxiliary magnetization control layer.

On the other hand, when the atomic percentage of Co is too high, the tolerance of the auxiliary magnetization control layer with respect to the ion beam etching decreases. A relationship between the atomic percentage of Co and the film thickness lower limit value of the auxiliary magnetization control layer was examined based on the case of the CoFe layer/CoZrTa layer. The film thickness lower limit value was obtained as the remaining film thickness that can keep the exchange coupling strength of the initial value of 90% according to cases for each atomic percentage of Co (75%, 80%, 85%, 90%, 95%, and 97%). Using the film thickness lower limit value of 3.2 nm of the CoFe layer/NiFe layer as a standard, it was set as a desirable range that the atomic percentage of Co falls below the standard. As shown in FIG. 10, when the atomic percentage of Co approaches 100%, the film thickness lower limit value rapidly increases. However, when the atomic percentage of Co is no more than 96%, the film thickness lower limit value is less than the film thickness lower limit value of 3.2 nm in the CoFe layer/NiFe layer. Additionally, even in the cases of the CoFe layer/CoZrTa layer/NiFe layer and the CoZrTa layer, a fundamental tendency is considered the same, and the atomic percentage of Co is desired to be no more than 96%.

As a result, the atomic percentage in the case of the CoZrTa layer is desired to be no less than 80%, and no more than 96%. An example of a particular desirable composition is $Co_{90}Zr_5Ta_5$.

A description of the preferred embodiment according to the present invention was given above in detail. However, it should be appreciated that a wide variety of alterations and modifications are possible as far as they do not depart from the spirit and scope of the attached claims.

What is claimed is:

1. A method of manufacturing a thin film magnetic head, the thin film magnetic head comprising:
   a magneto-resistance (MR) stack configured with a lower magnetization free layer whose magnetization direction varies according to an external magnetic field, a non-magnetic intermediate layer, and an upper magnetization free layer whose magnetization direction varies according to the external magnetic field, the layers being respectively contacted and positioned in the above order from a substrate;
   a lower magnetization control layer that is positioned between the substrate and the lower magnetization free layer, whose magnetization direction is fixed in a direction parallel to an air bearing surface (ABS);
   a lower exchange coupling layer that is positioned between the lower magnetization free layer and the lower magnetization control layer, generating an exchange coupling between the lower magnetization free layer and the lower magnetization control layer;
   an upper shield layer that is disposed at an opposite side from the substrate with respect to the MR stack, including an upper magnetization control layer whose magnetization direction is fixed in a direction parallel to the ABS, the upper magnetization control layer disposed at an edge surface close to the upper magnetization free layer of the upper shield layer;
   an upper exchange coupling layer that is positioned between the upper magnetization free layer and the upper magnetization control layer, generating an exchange coupling between the upper magnetization free layer and the upper magnetization control layer, wherein the magnetization direction of the lower magnetization free layer due to the exchange coupling between the lower magnetization free layer and the lower magnetization control layer and the magnetization direction of the upper magnetization free layer due to the exchange coupling between the upper magnetization free layer and the upper magnetization control layer are antiparallel;
   a bias magnetic field application layer that is positioned at a rear side of the MR stack relative to the ABS, applying a bias magnetic field that is in an orthogonal direction with respect to the ABS to the MR stack, and
   in which a sense current flows in an orthogonal direction with respect to a film surface of the MR stack;
   the method comprising:
   laminating each of the layers from the lower magnetization control layer to the upper exchange coupling layer above the substrate;
   laminating an auxiliary magnetization control layer including at least a CoZrTa layer above the upper exchange coupling layer;
   forming at least each of the layers from the lower exchange coupling layer to the auxiliary magnetization control layer in a pillar shape, and disposing the bias magnetic field application layer at an opposite position with respect to the ABS of each of the pillar shaped layers;

trimming the auxiliary magnetization control layer by removing a part of the auxiliary magnetization control layer that is formed in the pillar shape; and disposing the upper shield layer such that the trimmed auxiliary magnetization control layer is at least covered.

2. The method of manufacturing the thin film magnetic head of claim 1, wherein the upper shield layer includes a NiFe layer contacting the auxiliary magnetization control layer that functions as the upper magnetization control layer and a CoFe layer positioned on the NiFe layer in a contacting manner;

the upper shield layer further includes an upper antiferromagnetic layer on the CoFe layer in a contacting manner; and the laminating of the auxiliary magnetization control layer includes laminating another CoFe layer on the upper exchange coupling layer first, then the CoZrTa layer in the order.

3. The method of manufacturing the thin film magnetic head of claim 2, wherein the CoFe layer has a film thickness of 1 nm, and the CoZrTa layer has a film thickness in a range from 1.5 nm through 3.1 nm after being trimmed.

4. The method of manufacturing the thin film magnetic head of claim 1, wherein, the upper shield layer includes a NiFe layer contacting the auxiliary magnetization control layer that functions as the upper magnetization control layer and a CoFe layer positioned on the NiFe layer in a contacting manner;

the upper shield layer further includes an upper antiferromagnetic layer on the CoFe layer in a contacting manner; and the laminating of the auxiliary magnetization control layer includes respectively laminating another CoFe layer, the CoZrTa layer and another NiFe layer on the upper exchange coupling layer in the order.

5. The method of manufacturing the thin film magnetic head of claim 4, wherein the CoFe layer has a film thickness of 1 nm, the CoZrTa layer has a film thickness of 1 nm, and the NiFe layer has a film thickness in a range from 0.9 nm through 2.1 nm after being trimmed.

6. The method of manufacturing the thin film magnetic head of claim 1, wherein, the upper shield layer includes a NiFe layer contacting the auxiliary magnetization control layer that functions as the upper magnetization control layer and a CoFe layer positioned on the NiFe layer in a contacting manner;

the upper shield layer further includes an upper antiferromagnetic layer on the CoFe layer in a contacting manner; and the laminating of the auxiliary magnetization control layer includes laminating only the CoZrTa layer on the upper exchange coupling layer.

7. The method of manufacturing the thin film magnetic head of claim 6, wherein the CoZrTa layer has a film thickness in a range from 2.2 nm through 4.1 nm after being trimmed.

8. The method of manufacturing the thin film magnetic head of claim 1, wherein, an atomic percentage of Co of the CoZrTa layer is in a range from 80% through 96%.

9. The method of manufacturing the thin film magnetic head of claim 1, wherein the thin film magnetic head includes a lower shield layer that is disposed at a substrate side of the MR stack and the lower magnetization control layer is disposed at an edge surface of the lower magnetization free layer side of the lower shield layer;

the laminating of each of the layers from the lower magnetization control layer to the upper exchange coupling layer above the substrate includes laminating a lower shield layer above the substrate, and laminating each of the layers from the lower exchange coupling layer to the auxiliary magnetization control layer on the lower shield layer.

10. The method of manufacturing the thin film magnetic head of claim 1, wherein the upper and lower exchange coupling layers are made of Ru and being 0.8 nm in thickness.

11. A thin film magnetic head, comprising:

a magneto-resistance (MR) stack configured with a lower magnetization free layer whose magnetization direction varies according to an external magnetic field, a non-magnetic intermediate layer, and an upper magnetization free layer whose magnetization direction varies according to the external magnetic field, these layers being respectively contacted and positioned in order from a substrate;

a lower magnetization control layer that is positioned between the substrate and the lower magnetization free layer, whose magnetization direction is fixed in a direction parallel to an air bearing surface (ABS);

a lower exchange coupling layer that is positioned between the lower magnetization free layer and the lower magnetization control layer, generating an exchange coupling between the lower magnetization free layer and the lower magnetization control layer;

an upper shield layer that is disposed at an opposite side from the substrate with respect to the MR stack, including an upper magnetization control layer whose magnetization direction is fixed in a direction parallel to the ABS, the upper magnetization control layer disposed at an edge surface close to the upper magnetization free layer of the upper shield layer;

an upper exchange coupling layer that is positioned between the upper magnetization free layer and the upper magnetization control layer, generating an exchange coupling between the upper magnetization free layer and the upper magnetization control layer, wherein the magnetization direction of the lower magnetization free layer due to the exchange coupling between the lower magnetization free layer and the lower magnetization control layer and the magnetization direction of the upper magnetization free layer due to the exchange coupling between the upper magnetization free layer and the upper magnetization control layer are antiparallel;

an auxiliary magnetization control layer that is positioned between the upper exchange coupling layer and the upper shield layer, including at least a CoZrTa layer; and a bias magnetic field application layer that is positioned at an opposite side with respect to the ABS of the MR body, applying an bias magnetic field that is in an orthogonal direction with respect to the ABS to the MR stack, wherein a sense current flows in an orthogonal direction with respect to a film surface of the MR stack.

* * * * *